(12) United States Patent
Likovich, Jr. et al.

(10) Patent No.: US 7,246,332 B2
(45) Date of Patent: Jul. 17, 2007

(54) METHODS, SYSTEMS AND MEDIA FOR FUNCTIONAL SIMULATION OF NOISE AND DISTORTION ON AN I/O BUS

(75) Inventors: Robert Brian Likovich, Jr., Raleigh, NC (US); Joseph David Mendenhall, Cary, NC (US); John Christopher Morris, Durham, NC (US); Robert James Reese, Austin, TX (US); Chad Everett Winemiller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 11/053,078

(22) Filed: Feb. 8, 2005

(65) Prior Publication Data

US 2006/0190857 A1    Aug. 24, 2006

(51) Int. Cl.
*G06F 17/50* (2006.01)
(52) U.S. Cl. .................. 716/4; 716/5; 703/13
(58) Field of Classification Search ................ 716/4–6; 703/13–14
See application file for complete search history.

(56) References Cited

U.S. PATENT DOCUMENTS

| | | | | |
|---|---|---|---|---|
| 5,920,490 A | * | 7/1999 | Peters | 716/2 |
| 6,073,249 A | * | 6/2000 | Watabe et al. | 714/4 |
| 6,131,079 A | * | 10/2000 | Smith | 703/13 |
| 6,678,625 B1 | * | 1/2004 | Reise et al. | 702/117 |
| 6,718,521 B1 | * | 4/2004 | Bentlage et al. | 716/4 |
| 2002/0038401 A1 | * | 3/2002 | Zaidi et al. | 710/305 |
| 2005/0015686 A1 | * | 1/2005 | Atoji et al. | 714/100 |
| 2005/0209840 A1 | * | 9/2005 | Baklashov et al. | 703/22 |
| 2005/0220121 A1 | * | 10/2005 | Sharma et al. | 370/395.62 |
| 2005/0283749 A1 | * | 12/2005 | Yeh | 716/6 |
| 2006/0070053 A1 | * | 3/2006 | Andersen et al. | 717/163 |

* cited by examiner

*Primary Examiner*—Stacy A Whitmore
(74) *Attorney, Agent, or Firm*—Joscelyn G. Cockburn; Schubert Osterrieder & Nickelson PLLC

(57) ABSTRACT

Methods, systems, and media for functional simulation of an I/O bus are disclosed. More particularly, a method of simulating distortion and noise parameters of an I/O bus is disclosed. Embodiments include constraining one or more fields of a record and determining delay amounts based on the resulting parameters, where the final delay amount includes a delay buffer and a net of delay amounts associated with the parameters. Embodiments may also include determining a value of a next bit to be sent to the I/O bus and, after waiting the delay amount, driving the bit on the bus to the next bit value. Parameters may include skew, jitter, duty cycle distortion, voltage reference distortion, and drift of any of these parameters. Further embodiments may include signaling the end of a phase in response to a phase done condition being satisfied.

20 Claims, 4 Drawing Sheets

METHODS, SYSTEMS AND MEDIA FOR FUNCTIONAL SIMULATION OF NOISE AND DISTORTION ON AN I/O BUS

CROSS-REFERENCES TO RELATED APPLICATIONS

Pursuant to 35 USC §119(e), this application claims priority to and benefit of U.S. patent application Ser. No. 11/053,220, entitled "METHODS, SYSTEMS AND MEDIA FOR MANAGTNG FUNCTIONAL VERIFICATION OF A PARAMETERIZABLE DESIGN", filed on the same day, the disclosure of which is incorporated herein in its entirety for all purposes.

FIELD OF INVENTION

The present invention generally relates to the field of functional simulation and verification of complex systems. More particularly, the present invention relates to methods, systems, and media for functional simulation of noise and distortion on an Input/Output (I/O) bus.

BACKGROUND

When designing increasingly complex processors or IC chips such as Application-Specific ICs (ASICs) and system-on-chips (SoC's), functional verification has proven to be a major bottleneck in achieving time-to-market goals. Many companies now realize that functional verification of complex chips has become an inefficient, unwieldy, and incomplete process. Design teams report that functional verification of medium- to large-complexity processors, ASICs or SOC's may consume over 70% of the project's manpower, schedule and budget. In spite of the time and resources consumed by functional verification, it is still often incomplete, allowing design bugs to go undetected. Improved functional verification can cut costs, improve design quality and accelerate time-to-market, as well as allowing companies to sharply increase the productivity of precious verification personnel.

The design process for a chip starts with the creation of a functional specification for the design. Once the functional specification has been completed, the verification team typically creates a test plan that specifies the design features and functions to be tested at both the block and system levels. The verification team then creates tests such as deterministic tests and weighted-random tests to verify design functionality until all test plan requirements have been met. The verification process involves developing and simulating tests that are used to determine whether design components (e.g., processor units, I/O busses, resources, functions, etc.) behave according to their functional specification in a process known as functional simulation. Functional verification is often an iterative process where the entire system (or at least all its major features) is tested on a continuous basis for the duration of the design process. Functional verification is typically completed before fabrication, as finding and fixing errors, or bugs, after fabrication proves to be time-consuming and expensive. Functional coverage is the study and analysis of the quality and completeness of functional verification. It includes statistical, stochastic and heuristic analysis of functional verification progress and completeness.

Formal methods can be applied to the design for verification of design features, as well as identifying design connectivity and signal propagation characteristics. In most such cases, a set of formal rules or design behavior specifications are defined and applied against a compiled model of the design to identify any deviation from the formal specification (rules). Some tools can generate a set of checkers and monitors from the formal rules which can then be used along with the simulation-based verification.

Software tools have been developed to help designers and testers with the functional verification process. A design under test (DUT) may be described using a hardware description language (HDL) such as VHSIC (Very High Speed Integrated Circuits) HDL (VHDL) or Verilog. Automation tools such as Verisity Design, Inc.'s (Verisity) Specman testbench automation software provide an environment for generation of functional tests, data and temporal checking, functional coverage analysis, and HDL simulation control.

Some design components require sophisticated modeling in order to properly simulate their performance (and thus to complete functional verification). Functional verification of a high-speed, self-aligning, elastic I/O design, for example, poses problems with existing verification environments. An elastic interface design, in one example, allows an external receiver communicating with a similar elastic interface transmitter to deskew (line up) the data bits within each clock-data group to account for path variance across the bus, to align separate clock-data groups after they have been deskewed to compensate for noise, to adjust for non-ideal duty cycles and voltage reference (VRef) distortion, and to make dynamic recalibrations to keep the bus aligned and sampling correctly during variations of voltage and temperature. Current environments are unable to satisfactorily model many aspects of elastic I/O bus designs, such as gradual drift of noise and distortion parameters. There is, therefore, a need for an improved mechanism for functional simulation and verification of components such as high-speed bus designs.

SUMMARY OF THE INVENTION

The problems identified above are in large part addressed by methods, systems, and media for simulating noise and distortion on an I/O bus. One embodiment generally provides a method for simulating noise and distortion parameters of an I/O bus. The method may generally include constraining one or more fields of a record based on one or more parameters of the I/O bus. The method may also generally include determining a net delay value based on the one or more parameters and determining a final delay amount based on the delay buffer and the net delay amount. The method may also generally include determining a value of a next bit to be sent to the I/O bus and, after waiting for the final delay amount, driving the bit on the bus to the next bit value. In alternative embodiments, the method may also include, where the record includes one or more phase fields each including one or more phase done conditions, calling a time consuming method to wait until one or more phase done conditions are satisfied and, in response to the one or more phase done conditions being satisfied, signaling the end of the phase.

Another embodiment provides a machine-accessible medium containing instructions effective, when executing in a data processing system, to cause the system to perform a series of operations for synchronizing a database on a network. The series of operations may generally include constraining one or more fields of a record based on one or more parameters of the I/O bus. The series of operations may also generally include determining a net delay value based on the one or more parameters and determining a final delay amount based on the delay buffer and the net delay amount. The series of operations may also generally include determining a value of a next bit to be sent to the I/O bus and, after waiting for the final delay amount, driving the bit on the bus to the next bit value. In alternative embodiments, the series of operations may also include, where the record includes one or more phase fields each including one or more phase done conditions, calling a time consuming method to wait until one or more phase done conditions are satisfied and, in response to the one or more phase done conditions being satisfied, signaling the end of the phase.

A further embodiment provides a system for simulating noise and distortion parameters of an I/O bus. The system may include a verification environment for constraining one or more fields of a record based on one or more parameters of a design under test, where the record has one or more fields associated with it. The system may also include a bus agent for launching a time consuming method to simulate one or more of the parameters of the design under test. The bus agent may have one or more bus functional models for stimulating the design under test based on the simulated parameters of the design under test. In a further embodiment, the time consuming method may determine a final delay amount and the bus agent may include a second time consuming method to wait for the final delay amount before driving a bit to a new value.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Methods, systems, and media for functional simulation of an I/O bus are disclosed. More particularly, a method of simulating distortion and noise parameters of an I/O bus is disclosed. Embodiments include constraining one or more fields of a record and determining delay amounts based on the resulting parameters, where the final delay amount includes a delay buffer and a net of delay amounts associated with the parameters. Embodiments may also include determining a value of a next bit to be sent to the I/O bus and, after waiting the delay amount, driving the bit on the bus to the next bit value. Parameters may include skew, jitter, duty cycle distortion, voltage reference distortion, and drift of any of these parameters. Further embodiments may include signaling the end of a phase in response to a phase done condition being satisfied. A phase may represent a temporal segment of a test having a certain mode and data pattern with various clock and data parameters applied.

The methods, systems, and media of the disclosed embodiments provide an improved mechanism for simulating noise and distortion parameters of an I/O bus. The system of the disclosed embodiments is particularly suited for simulating the effects of noise, temperature variations, and voltage variations on elastic I/O designs. Functional verification and simulation may be improved by the ability to test asynchronous parameters without having to resort to 'brute force' approaches with thousands of tests or rely on circuit simulation and timing results. Moreover, the system of the disclosed embodiments provides the ability to model various noise and distortion parameters which previously could not be satisfactorily modeled using existing verification environments.

Figure 1:
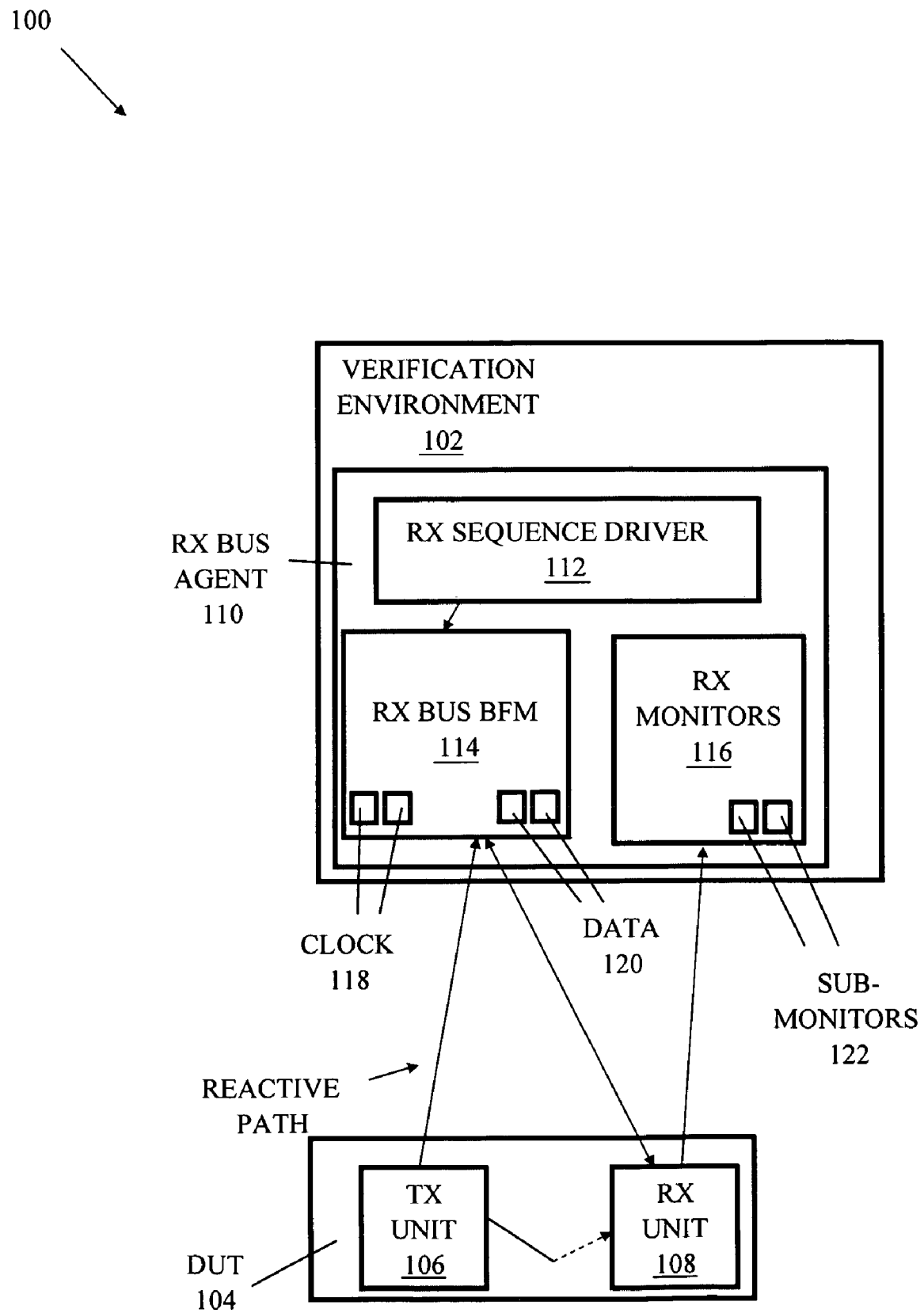
FIG. 1 depicts an environment for a system for performing functional verification of a design according to one embodiment.

Turning now to the drawings, FIG. 1 depicts an environment for a system for performing functional verification of a design according to one embodiment. Functional verification system 100 may include a verification environment 102 in communication with a design under test (DUT) 104, which may represent an I/O bus design or other design. The verification environment 102 may serve as a stimulus mechanism and drive various kinds of clock and data patterns onto the DUT 104 in a controllable fashion. By doing so, the verification environment 102 may simulate various states of the DUT 104 to simulate and eventually verify its performance and design. The verification environment 102 and the DUT 104 may, in one embodiment, be software and/or state machines implemented on one or more of any type of computer system, including servers, personal computers, workstations, mainframe computers, notebook or laptop computers, desktop computers, or the like. In one example, the verification environment 102 may be implemented on an IBM® eServer or similar server having one or more processors, or threads of processors, executing software and/or one or more state machines coupled with data storage devices such as random access memory (RAM), read only memory (ROM), flash memory, compact disk drives, hard drives, and the like.

The DUT 104 may represent an I/O bus whose design is being functionally simulated and verified by the functional verification system 100. The DUT 104 may be described using a hardware description language such as VHDL or Verilog. The DUT 104 may include a TX unit 106 and an RX unit 108 representing the transmission and receiving functions of an I/O bus. During verification, the verification environment 102 may drive the TX unit 106 and/or the RX unit 108 to simulate various test conditions. In one embodiment, the DUT 104 may represent a high-speed, self-aligning, elastic I/O design. An elastic interface design allows an external receiver communicating with a similar elastic interface transmitter to deskew (line up) the data bits within each clock-data group to account for path variance across the bus, to align separate clock-data groups after they have been deskewed to compensate for noise, to adjust for non-ideal duty cycles and voltage reference (VRef) distortion, and to make dynamic recalibrations to keep the bus aligned and sampling correctly during variations of voltage and temperature. The system of the disclosed embodiments provides an effective means of simulating an elastic I/O design, including the asynchronous parameters representing changes in performance caused by noise or variations in temperature or voltage.

The verification environment 102 may be a software tool (or may be developed using any software tool) that helps designers and testers with the functional verification process by automating testbenches, running simulations, and the like. The verification environment 102 may generate design stimuli, provide stimulus to the DUT 104, and then monitor and check the responses to the stimulus. Verification environment 102 may include any simulators or tests that are used in the functional verification process. The simulators and/or tests may be distributed over multiple servers or computers. Simulations (including tests or the results of simulators) may test for failures (also known as bugs or faults) in the design, which are situations where the logic expressed in the design language (e.g., VHDL, Verilog) does not perform correctly under specific situations. Many tests must typically be performed to properly functional verify a design. To handle the large amount of tests, verification environment 102 may take advantage of existing verification automation tools such as Verisity Design, Inc.'s (Verisity) Specman testbench automation software, which provides an environment for generation of functional tests, data and temporal checking, functional coverage analysis, and HDL simulation control. Any other type of testbench automation software may be used, including code written in C++.

In the depicted embodiment, verification environment 102 includes an RX bus agent 110, which itself may include an RX sequence driver 112, an RX bus BFM 114, and RX monitors 116. The RX bus BFM 114 may include one or more clock BFMs 118 and one or more data BFMs 120, which may also be referred to as bit BFMs. The RX monitors 116 may each include one or more sub-monitors (such as bit monitors) 122 for monitoring particular bits of the DUT 104. The verification environment 102 may include other components as well, such as local clock agents, control agents, or TX bus agents, but FIG. 1 and its description are limited in the interest of clarity and brevity.

The verification environment 102 may drive the DUT 104 by generating patterns and stimulus for the RX bus BFM 114 of the RX bus agent 110 to transmit directly to the RX unit 108 of the DUT 104. The patterns and stimulus may be included as part of a record, which may represent a grouping of parameters to stimulate the DUT 104. Records may be high-level representations of DUT 104 stimulus consisting of one or more test items, each of which may represent a particular parameter or group of parameters. In one embodiment, the record may specify various parameters required to run or simulate the DUT 104, such as a mode of operation, a range for each parameters (high and low values and the like), and criteria for terminating the phase ('done' criteria). In one embodiment, sequences in Specman may be represented as records.

The verification environment 102 may generate clock and data records (or Specman sequences) in response to input from a test writer specifying various parameters to be tested or simulated in the DUT 104. The clock and data records may next go to the RX sequence driver 112 of the RX bus agent 110. The RX sequence driver 112 may generate sequence items and drive them to the RX bus BFM 114. At the RX bus BFM 114, the sequence items may be used to set various parameters for the clocks and data at different levels of hierarchy, such as the bus, clock group, and/or bit levels. Parameters may include skew, drift, jitter, synchronized jitter, duty cycle distortion, VRef distortion, delay element drift, or drift of any of the parameters. Each record may either change these parameters or leave them as they were in the previous record. The clock BFM 118 and data BFM 120 of the RX bus BFM 114 may then, for example, use these parameters to drive the RX bus inputs of the RX unit 108. The RX monitor 116 may monitor and receive information from the RX unit 108.

The verification environment 102 may drive the DUT 104 in either a reactive or proactive mode. In the reactive mode, the TX unit 106 of the DUT 106 may drive out various clock and data patterns which the RX bus agent 114 may then intercept via a reactive path. In this mode, the RX bus BFM 114 may drive the RX unit 108 based on a possibly distorted or delayed version of the intercepted data. In the more flexible and powerful proactive mode, the verification environment 102 may generate patterns and stimulus for the RX bus BFM 114 to transmit directly to the RX unit 108, breaking the link between the TX unit 106 and RX unit 108. Either mode, or any other type of mode, may be used by the verification environment 102.

Previous verification environments for functional verification were limited in their ability to simulate noise and distortion parameters of an elastic I/O bus. Designs could be verified via behavioral VHDL testbenches and simulation scripts that would explicitly force on signals in the design in a brute force attempt at simulation of a DUT 104. This technique is limited in that each test could only, for example, alter skew characteristics at set intervals and could not gradually drift skew values or perform more complex distortions such as jitter or VRef distortion. This technique would also require thousands of tests to accomplish any significant degree of randomness. In contrast, the verification environment of the disclosed embodiments allows test writers to drive many kinds of distorted clock and data patterns onto the bus design being tested in a controllable yet randomized fashion, providing enhanced capabilities and reducing the number of tests required.

Figure 2:
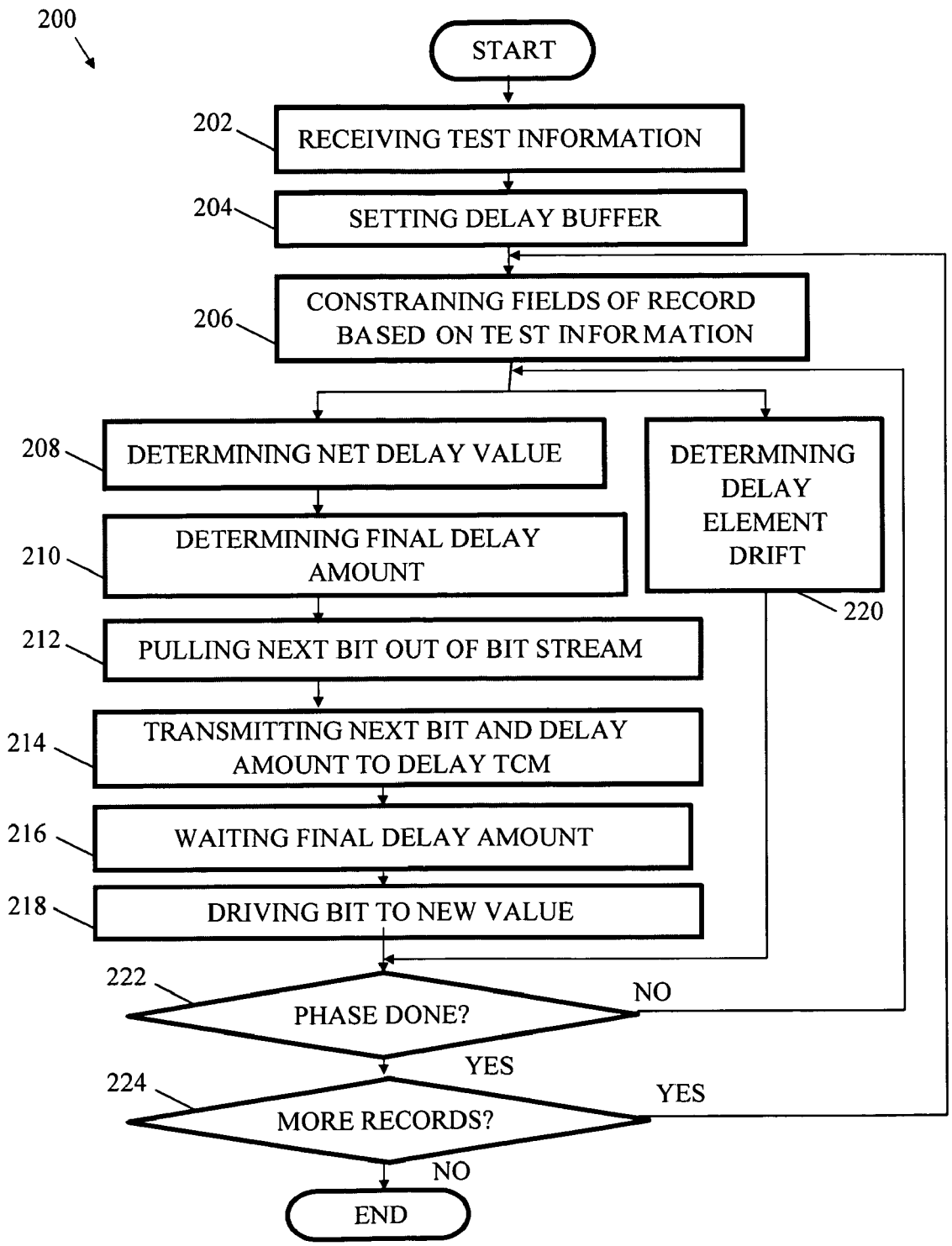
FIG. 2 depicts an example of a flow chart for simulating noise and distortion parameters of an I/O bus according to one embodiment.

FIG. 2 depicts an example of a flow chart for simulating noise and distortion parameters of an I/O bus according to one embodiment. The elements of flow chart 200 may be performed, in one embodiment, by components of a verification environment 102, or they may be performed by other components or combinations of components in the functional verification system 100. Flow chart 200 begins with element 202, receiving test information. Test information may be received by the verification environment 102 from any source. Sources of test information may include input from test writers via input files, user interfaces, or the like. The test information may include one or more records, which may themselves include a desired mode of operation for a test phase, a range or characteristics of parameters for a phase, a clock frequency for the test, phase termination criteria (e.g., number of cycles for a particular segment of the test to run, etc.), or other test information. A range or characteristic of a parameter may include, for example, an upper or lower limit for a parameter, drift characteristics for a parameter, or the like.

After receiving the test information, the verification environment 102 may set the delay buffer at element 204. The delay buffer, which may be determined by the test writer, serves as the initial delay amount. The delay buffer may represent a 'cushion' that is added to a net delay value calculated subsequently to allow for simulation of negative drift (which appears as if the bus temporarily speeds up). In one example, the delay buffer may be a combination of one-half the limit of bus elasticity plus an error margin. If, in this example, the bus elasticity is four bit times (where one bit time equals one-half cycle) and the error margin is two bit times, the delay buffer would be (4/2+2) four bit times or 2 cycles. Assuming a bit time of 400 picoseconds (ps), the delay buffer would then be 1600 ps. Any methodology for setting the delay buffer may be used, including calculating the delay buffer based on any factors (e.g., bus elasticity, bit times, user input, etc.), receiving a delay buffer from a user, etc.

After setting the delay buffer, the verification environment 102 may, at element 206, constrain one or more fields of a record based on the test information received at element 206. The verification environment 102 may use default settings in a situation where the test information does not specify particular requirements. The records may be high-level representations of stimulus of the DUT 104 that will get sent to the appropriate agent for transmission to the DUT 104.

After a record is generated, flow chart 200 may take either or both of two branches. In one branch, the process of simulating the parameters specified in the record and generating a final delay amount begins. In the other branch, the delay element drift, which acts on the delay mechanisms within the VHDL itself as opposed to bus delays, may be determined. Either or both paths may be taken for each phase. In one embodiment, the final delay amount branch may be performed by a time-consuming method (TCM) feature of Verisity's Specman. A TCM may be a procedure that takes some amount of simulation time to execute and may be executing at, for example, the RX bus agent 110. While the use of a TCM is described in relation to FIG. 2, any methodology for determining a final delay amount and simulating the delay may be used.

The final delay amount branch may begin with element 208, where the TCM may determine the net delay value. The net delay value may be the sum of delays caused by skew, jitter, duty cycle distortion, and VRef distortion, as well as from drift of those parameters. The net delay value determination is described in more detail in relation to FIG. 3. The TCM may next determine the final delay amount at element 210 after the net delay value has been determined at element 208. The final delay amount may represents the delay caused by the noise and distortion or other asynchronous parameters and may, in one embodiment, be determined by adding the delay buffer to the determined net delay value. Data being launched may be delayed an amount of time after its generation equal to the delay amount. For example, if the delay buffer equaled 1600 ps and a skew parameter resulted in the net delay value being 10 ps, the final delay amount would be 1610 ps (1600+10) and data would be launched 1610 ps after generation. Similarly, if a −2 ps per bit time drift was initiated on a bit and the delay buffer equaled 1600 ps, by the tenth bit time after beginning the drift the data would be launched 1580 ps (1600+(−2*10)) after generation as the net delay value (and thus the final delay amount) drops. With other bits on the bus remaining 'fixed' relative to a reference clock, it would appear that this bit was being transmitted faster as time progressed. The delay buffer enables the ability to simulate negative drift (such as from a bus speeding up) as well as positive drift.

After determining the delay amount at element 210, the TCM may pull the next bit out of the data bit stream at element 212 and transmit the next bit and delay amount to a delay TCM at element 214. The next bit stream may be a data bit stream generated by the agent to serve as a list of data that will be sent out to the bus based on a pattern and error injection options. The delay TCM may be a second TCM launched to simulate delay caused by the noise and distortion parameters. After launching, the delay TCM may then wait for the final delay amount at element 216 and then transmit the bit to the DUT 104 or otherwise drive the bit to a new value at element 218. The first TCM may launch multiple instances of delay TCM's as necessary to account for multiple bits which have been queued for transmission (which may result in overlapping delays).

The clock BFM 118 and the data BFM 120 may be handled differently by the TCM's. The data BFM 120 may be handled as described previously, where the next bit value and the delay amount are passed to the delay TCM, which waits for the delay amount and drives the bit to its new value. Duty cycle distortion, however, typically does not apply to the operation of the data BFM 120. The clock BFM 118, on the other hand, may be subject to duty cycle distortion and the current value for a clock BFM 118 is typically the inverse of its previous value, as opposed to extracting a bit value out of a pre-generated bit stream for the data BFM 120 to determine the next bit.

Verisity's Specman is particularly useful for implementing the methodology of FIG. 2, as its TCM abilities, wait delay construct (a statement which causes a TCM to wait for some during of simulation time), and multi-threaded TCM capabilities may be advantageously utilized. The multi-threaded TCM capabilities of Specman allow the same delay TCM to be launched multiple times in parallel. While FIG. 2 is described using aspects of Specman, one skilled in the art will recognize that other software packages or languages may be used, such as C++ or other languages or other VHDL or Verilog testbench automation packages.

The delay element drift branch may include element 220, where the delay element drift may be determined. Element 222 may be performed by a component of the verification environment 102 on the DUT 104 itself, as delay elements are internal to the design. Delay element drift represents distortion of the DUT 104 over time or because of temperature or voltage variations. The parameters described previously represent distortion on the bus itself (i.e., in transit from the TX unit to the RX unit). In contrast, the delay elements exist inside the elastic interface logic itself and are the mechanism for deskewing the bus. When temperature or voltage changes on a chip including the bus, the delay parameters for these elements will change as well, making it desirable to compensate for this change. In one embodiment, delay element drift may be represented by causing the VHDL delay element timing characteristics to change over time. To simulate the delay element drift, a method may be used to cause the delay values to change their timing characteristics during simulation. The actual VHDL delay time value, in one embodiment, may be controlled via the Specman environment using global signals in the design. In order to start a drift, for example, a control sequence may be used to alter the integer delay values on the global signals which, in turn, affect the VHDL timing values during simulation. Other methodologies for simulating delay element drift may also be utilized.

After completing either or both branches, flow chart 200 continues to decision block 222, where the verification environment 102 may determine (such as by using the method of FIG. 4) whether the phase is done or not. If the phase is not done, flow chart 200 returns to the beginning of the branches after element 206 and repeats either or both branches. In one embodiment, a TCM may run once per cycle but may launch multiple concurrent delay TCM's to account for delay amounts for different bits. If the phase is done, flow chart 200 continues to decision block 224, where the verification environment 102 determines whether there are more records. If there are no more records, the flow chart terminates, and if there are more records, the flow chart returns to element 206 to generate a new record.

Figure 3:
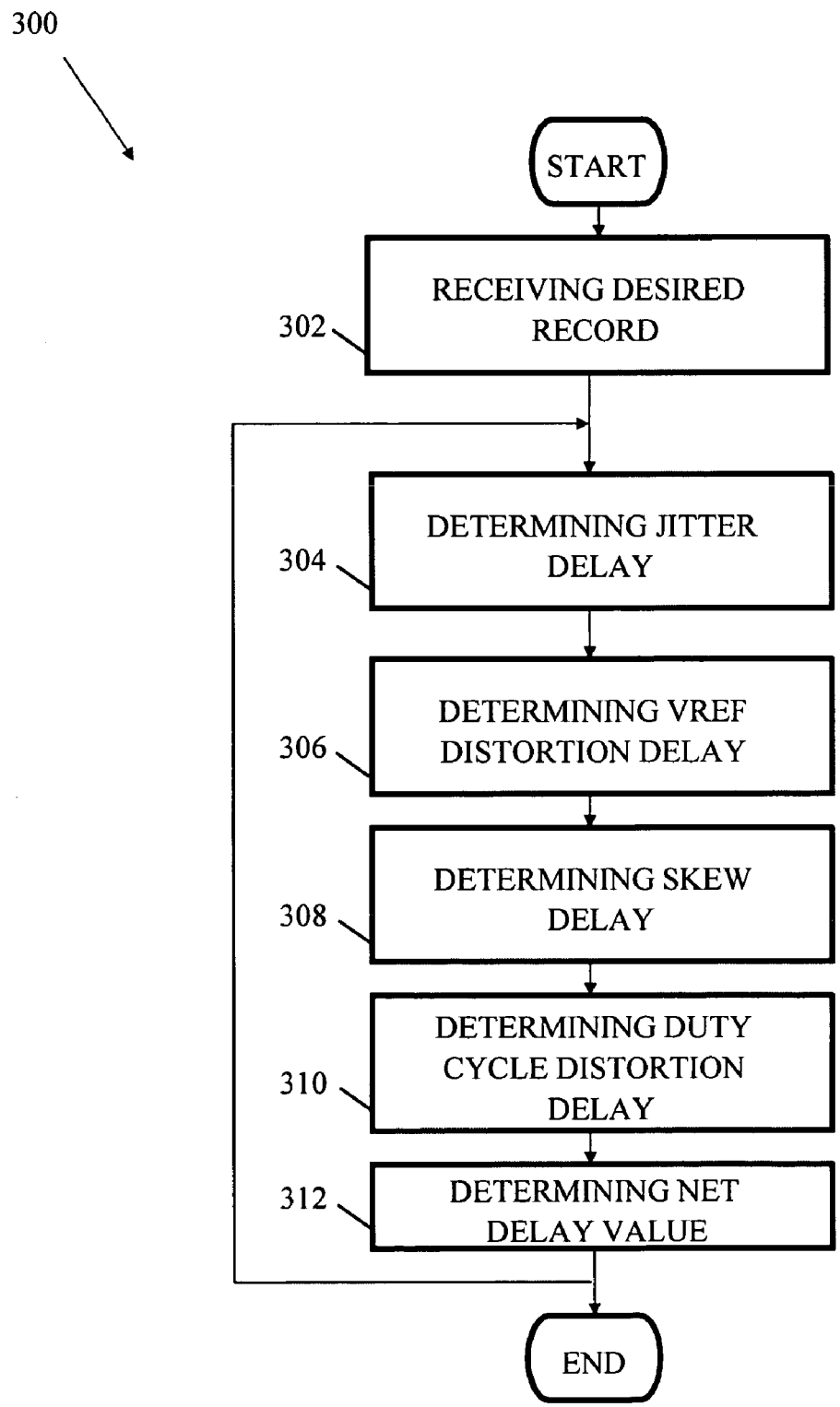
FIG. 3 depicts an example of a flow chart for determining a net delay value according to one embodiment.

FIG. 3 depicts an example of a flow chart for determining a net delay value according to one embodiment. The elements of flow chart 300 may be performed by components of a verification environment 102 such as a TCM executing in the RX bus agent 110, or they may be performed by any other component or combination of components. Flow chart 300 corresponds to element 208 of FIG. 2 where the net delay value is determined. Each element of flow chart 300 may, in one embodiment, be performed by a non-time-consuming method that executes almost simultaneously and consumes no simulation time. Each method may be launched from a recursive event which triggers 'on' blocks containing the actual method code. Flow chart 300 begins with element 302, receiving the desired record. Information within the record may be used to determine the net delay value.

After receiving the desired record, flow chart 300 may determine the delay caused by different parameters as well as determine simulated drift in those delays. Drift in a bus may be caused by temperature or voltage variations. The methods for determining the delay or distortion from a particular parameter may be constructed to continue emitting for the entire drift time that was selected via other parameters (e.g., start/stop times, frequency, etc.) and as specified in the record. The methods may cause drift at these intervals depending on the update percentage (how often during each evaluation the drift should occur) and the drift limits set by the user. Another variable may control whether the drift direction will reverse itself if a limit is reached. A test writer may thus create a parameter drift which occurs at an approximate rate but is somewhat random and not completely linear. A test writer may also configure the drift to stop at the upper or lower limit, reverse directions and swing between two limits until the drift period expires, or any other action. The result of any drift is a new skew, duty cycle distortion, or VRef distortion amount to be used as part of the net delay value calculation at element 312.

The process of determining the delay caused by the various parameters begins by determining the delay caused by jitter at element 304. Jitter may be the sum of both uncorrelated jitter and synchronized jitter. Uncorrelated jitter may be small, random fluctuations of skew from a reference point that may be introduced on any clock or data bit to simulate noise. Synchronized jitter is the same as uncorrelated jitter except that the jitter of data bits may be correlated to the jitter of their respective clock groups. The jitter delay value may also be subject to drift over time as previously described. Jitter may be calculated on a per-cycle basis and new values may be computed within the jitter ranges that may be specified in the record or otherwise. Jitter may result in small temporal fluctuations of either side of a reference (non-distorted) clock and data edges.

After determining the delay caused by jitter, the method of flow chart 300 continues to element 306, determining the VRef distortion value. VRef distortion may be simulated voltage reference distortion of clock and data bits that affects rise/fall times and switching thresholds, concepts that do not fit within traditional functional simulation. VRef distortion may also be subject to variances caused by drift. In one embodiment, the VRef distortion value may be determined by choosing a delay value that simulates the theoretical switching point of the clock or data bit. The VRef distortion value may consist of the difference between a reference amount and an effective distortion value. In this embodiment, the reference amount may be half the rise or fall time (a threshold of 50%) or any other amount. The effective distortion value may be the rise time multiplied by a rise threshold percentage (representing 0 to 100%) or a fall time multiplied by one hundred minus the fall threshold percentage (representing 100 to 0%). If, for example, a rise time of 50 ps and a threshold of 70% (meaning that the simulated switching point is 70% of the peak-to-peak voltage swing) is specified, the reference value would be 25 ps (half of the rise time) and the distortion value may be 35 ps, resulting in a VRef distortion value of 10 ps (35–25) after the reference edge. If a similar value was used for the falling edges, it would appear that the high clock or data pulses were closed or shortened by 20 ps total. For a typical 400 ps bit time single pulse, the high time would be 380 ps and the low time 420 ps in this example. Other methodologies for determining a VRef delay value are also possible. VRef distortion may be calculated on a per-cycle basis and new values may be computed within the VRef ranges that may be specified in the record or otherwise. The VRef delay value may be modified as a result of drift as well.

After determining the VRef distortion value, the method of flow chart 300 continues to element 308, determining the skew delay value. With skew, clock and data bits are delayed with respect to each other to simulate non-uniform transit times across the bus or DUT 104. The skew delay value may be determined based on upper and lower limits or other specified limits or changes to the skew delay value over time as drifts are applied to the skew delay.

The duty cycle distortion value may next be determined at element 310. Duty cycle distortion represents clocks with non-ideal (different than 50/50) duty cycles and may also change over time with drift.

Once the delays caused by the various parameters have been determined, the method of flow chart 300 continues to element 312, determining the net delay value. The net delay value may be the sum of the skew, jitter, VRef distortion, and duty cycle distortion. Flow chart 300 may either call the delay TCM or return to element 304 to repeat the calculations (such as for a new cycle, etc.) or may terminate if the phase done conditions have been met (as described in relation to FIG. 4).

Figure 4:
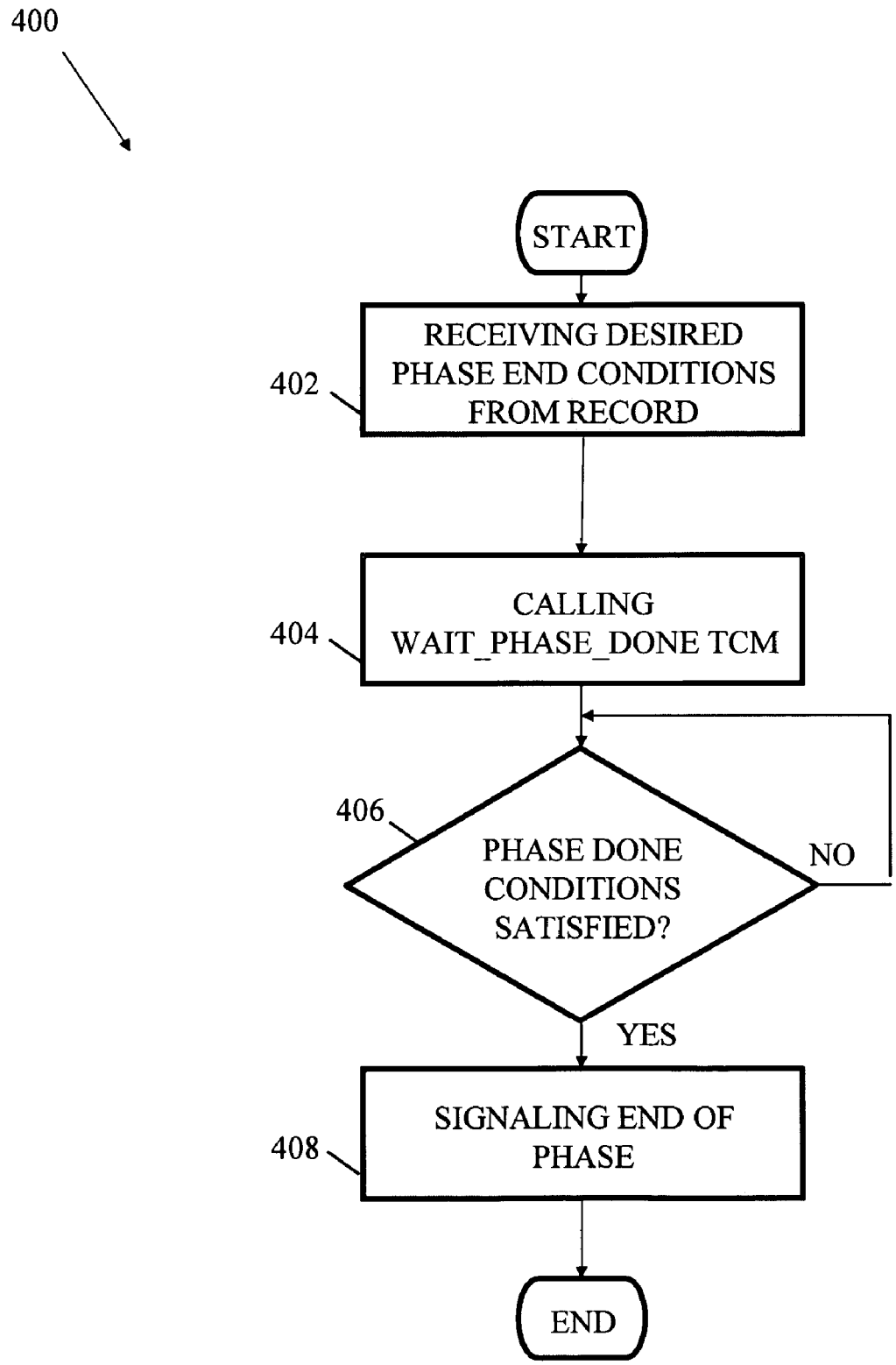
FIG. 4 depicts an example of a flow chart for controlling the termination of test phase via time consuming method according to one embodiment.

FIG. 4 depicts an example of a flow chart for controlling the termination of test phase via time consuming method according to one embodiment. The elements of flow chart 400 may be performed by components of a verification environment 102 or they may be performed by any other component or combination of components. Flow chart 400 may be implemented as a sub-method to element 206 of flow chart 200 of FIG. 2 where the verification environment 102 generates a record for test. Flow chart 400 begins with element 402, receiving desired phase end conditions from the record. The phase end conditions may be an indication of what criteria will result in the termination of the phase, such as a number of cycles, a particular state, or other criteria. The desired phase end conditions may be received as part of the test information from a test writer, such as described in relation to element 202 of FIG. 2. The method of FIG. 4 advantageously provides a common interface for controlling the termination of a phase where test writers or other users need not know the details of different agents, sequence drivers, what type of BFM is involved, etc., and yet may flexibly control the termination of a phase.

The phase done conditions may be added by a verification engineer as fields of a record and a test writer may constrain the fields by including the appropriate information within the phase done fields. Phases may be predefined such that they consume a predetermined amount of time or wait for certain signal states (by constraining the fields) before emitting the item_done which allows the phase to continue. In the disclosed embodiment, a test writer may constrain the phase done fields so that they can control the end of a test phase, giving them improved control. For example, phase done information may be added to a "phase_done_condition" field, which itself may be added to all records such that the test writer may control or constrain the end condition for each phase of a test. The phase done condition may be a user type which may be set to COUNT, STATE, STATE_OR, or any combination of these values. The COUNT type causes the TCM associated with a phase to wait a specified number of cycles before continuing. The STATE type causes the TCM associated with a phase to wait until each value in a defined list attains specified values, while the STATE_OR type causes the TCM associated with a phase to wait until at least one value of the list attains its specified value. All of these types, including combinations, may be included in a list of conditions for use in a PHASE_DONE field. For example, the list of conditions in the PHASE_DONE field may include COUNT, STATE, STATE_OR, and STATE_AND.

After receiving the desired phase end conditions from the record, the method of flow chart 400 calls a wait_phase_done TCM at element 404 which takes the values of the fields as arguments and waits until the phase done criteria are met before returning. The wait_phase_done TCM may wait at decision block 406 until the phase done criteria are satisfied. When the phase done criteria are satisfied, the method of flow chart 400 signals the end of the phase (such as by emitting a driver.item_done) at element 408, after which the method terminates, allowing the test to move on to the next phase.

In one embodiment, the phase done list may then be evaluated iteratively. An example of fields in a record may include:
.phase_done_condition={COUNT;   STATE_OR;   COUNT};
.phase_done_count=20;
.phase_done_signames={"~/:/top_level/test_passed",   "~/:/top_level/test_failed"};
.phase_done_signals={1,1};.

Once a phase is started based on the above condition list, a wait_phase_done TCM may be launched at element 406. In this example, the wait_phase_done TCM would then wait for 20 toggles of the local clock. After waiting the 20 toggles, it would then begin evaluating "test_passed" and "test_failed" and if either went high, the TCM would wait another 20 local clock cycles before exiting. The BFM may then emit a driver.item_done and the phase would complete, allowing the test to move on to the next phase.

By utilizing the method of flow chart 400, a test writer may achieve precise control over the test phases and does not have to rely on a record definition to cause the phases to end at the appropriate times. This may give the test writer more flexibility in generating meaningful tests and may provide enhanced capabilities to the test environment and verification environment 100.

Each software program described herein may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates methods, systems, and media for functional verification of an I/O bus. It is understood that the form of the invention shown and described in the detailed description and the drawings are to be taken merely as examples. It is intended that the following claims be interpreted broadly to embrace all the variations of the example embodiments disclosed.

What is claimed is:

1. A method for simulating noise and distortion parameters of an I/O bus, the method comprising:
constraining one or more fields of a record based on one or more parameters of the I/O bus;
determining a net delay value based on the one or more parameters;
determining a final delay amount based on a delay buffer and the net delay amount;
determining a value of a next bit to be sent to the I/O bus; and
after waiting for the final delay amount, driving the bit on the bus to the next bit value.

2. The method of claim 1, further comprising:
wherein the record comprises one or more phase done fields, the phase done fields comprising one or more phase done conditions;
calling a time consuming method to wait until the one or more phase done conditions are satisfied; and
in response to the one or more phase done conditions being satisfied, signaling the end of a phase.

3. The method of claim 1, further comprising determining a delay element drift for the I/O bus, wherein determining the net delay value based on the one or more parameters comprises determining the net delay value based on at least the determined delay element drift for the I/O bus.

4. The method of claim 1, further comprising receiving test information, the test information comprising desired test conditions relating to one or more parameters of the I/O bus.

5. The method of claim 1, wherein the delay buffer is based on bus elasticity and an error margin.

6. The method of claim 1, wherein determining the net delay value comprises determining a jitter delay value.

7. The method of claim 1, wherein determining the net delay value comprises determining a voltage reference (VRef) distortion delay value.

8. The method of claim 1, wherein determining the net delay value comprises determining a voltage reference (VRef) distortion delay value, the voltage reference distortion delay value comprising the difference between a reference amount and an effective distortion value.

9. The method of claim 1, wherein determining the net delay value comprises determining a skew delay value.

10. The method of claim 1, wherein determining the net delay value comprises determining a duty cycle distortion delay value.

11. The method of claim 1, wherein determining a value of a next bit to be sent to the I/O bus comprises pulling the next bit out of a data bit stream.

12. A machine-accessible medium containing instructions effective, when executing in a data processing system, to cause said data processing system to perform operations comprising:
   constraining one or more fields of a record based on one or more parameters of the I/O bus;
   determining a net delay value based on the one or more parameters;
   determining a final delay amount based on a delay buffer and the net delay amount;
   determining a value of a next bit to be sent to the I/O bus; and
   after waiting for the final delay amount, driving the bit on the bus to the next bit value.

13. The machine-accessible medium of claim 12, further comprising:
   wherein the record comprises one or more phase done fields, the phase done fields comprising one or more phase done conditions;
   calling a time consuming method to wait until the one or more phase done conditions are satisfied; and
   in response to the one or more phase done conditions being satisfied, signaling the end of a phase.

14. The machine-accessible medium of claim 12, further comprising determining a delay element drift for the I/O bus, wherein determining the net delay value based on the one or more parameters comprises determining the net delay value based on at least the determined delay element drift for the I/O bus.

15. The machine-accessible medium of claim 12, wherein determining the net delay buffer comprises determining one or more of a jitter delay value, a voltage reference (VRef) distortion delay value, a skew delay value, and a duty cycle distortion value.

16. The machine-accessible medium of claim 12, wherein determining a value of a next bit to be sent to the I/O bus comprises pulling the next bit out of a data bit stream.

17. A data processor executing a functional verification system for simulating noise and distortion parameters of an I/O bus, the functional verification system comprising:
   a verification environment, the verification environment constraining one or more fields of a record based on one or more parameters of a design under test, the record having one or more fields associated with it;
   a bus agent of the verification environment, the bus agent launching a time consuming method to simulate one or more parameters of the design under test; and
   the bus agent comprising one or more bus functional models, the one or more bus functional models stimulating the design under test based on the simulated parameters of the design under test.

18. The data processor of claim 17, wherein the time consuming method determines a final delay amount, and wherein further the bus agent further comprises a second time consuming method that waits for final delay amount before driving a bit to a new value.

19. The data processor of claim 17, wherein the design under test is an elastic I/O bus design.

20. The data processor of claim 17, wherein the one or more parameters comprise one or more of skew, jitter, synchronized jitter, voltage reference distortion, duty cycle distortion, or drift of any of the parameters.

* * * * *